United States Patent [19]

Gaboury

[11] Patent Number: 4,965,471
[45] Date of Patent: Oct. 23, 1990

[54] BI-CMOS CLOCK DRIVER WITH REDUCED CROSSOVER CURRENT

[75] Inventor: Michael J. Gaboury, Spencerport, N.Y.

[73] Assignee: Eastman Kodak Company, Rochester, N.Y.

[21] Appl. No.: 371,164

[22] Filed: Jun. 26, 1989

[51] Int. Cl.[5] .................. H03K 19/02; H03K 19/088; H03K 5/12

[52] U.S. Cl. .................................... 307/446; 307/456; 307/263; 307/570; 307/270

[58] Field of Search ...................... 307/443, 456, 262.3, 307/269, 272.1, 570, 530, 446, 542, 544, 546, 270

[56] References Cited

U.S. PATENT DOCUMENTS 4,456,837  6/1984  Schade, Jr. .................. 307/269

Primary Examiner—Stanley D. Miller
Assistant Examiner—Margaret Rose Wambach
Attorney, Agent, or Firm—Edward Dugas

[57] ABSTRACT

The present circuit is intended for use in providing CCD phase clocks. It has the benefit of reduced crossover currents which in turn reduces power consumption and device size requirements.

The circuit is comprised of a pair of folded cascode CMOS amplifier input stages, a pair of bipolar output stages containing vertical NPN transistors, and 2 PMOS sense transistors for each output stage for reducing the crossover current which occurs when switching output stages. These sense transistors reduce the power consumption of the circuit and the size of the transistors necessary for the output.

The input stage has the capability of operating from TTL or ECL signal inputs by selecting an input reference voltage. The folded cascode configuration also provides the level shifting necessary for inputs to the output stage's NPN transistors.

The sense transistors provide feedback in the form of the charge stored in the output transistors to prevent a pair of output transistors from turning on prior to the other pair turning off.

5 Claims, 5 Drawing Sheets

BI-CMOS CLOCK DRIVER WITH REDUCED CROSSOVER CURRENT

Field of the Invention

The present invention relates to clock driver circuits and more particularly, it relates to BI-CMOS driver circuits with reduced crossover current.

Description of the Prior Art

The problem addressed by the present invention is to provide a circuit for outputting complementary clock signals capable of driving relatively high capacitive loads. To accomplish this action, pull up and pull down (transistor) circuitry is used. What occurs in prior art circuits is that a finite transition time exists due to charge being stored in the output transistors. This leads to large spikes of current during the period when both output transistors are partially on. The prior art teaches a number of ways to minimize this effect by the use of devices to remove the charge from the output devices faster.

A group of representative prior art patents which use pull down transistors to insure a faster withdrawal of the charge stored in the output transistors is set forth below:

U.S. Pat. No. 4,616,146
U.S. Pat. No. 4,638,186
U.S. Pat. No. 4,678,940
U.S. Pat. No. 4,698,525
U.S. Pat. No. 4,733,110

A pair of U.S. Pat. Nos. 3,824,409 and input signal for the purpose of allowing a decision to be made in the first patent and to shape an output waveform based on two inputs in the second patent.

SUMMARY OF THE INVENTION

Accordingly, it is an obJect of the present invention to provide an improved BI MOS circuit having low power requirements and reduced device size requirements.

It is another obJect of the present invention to provide an improved driver circuit having a user adjustable output voltage crossover value.

In a preferred embodiment of the invention the above and other objects of the invention are achieved by providing (a) a pair of amplifier input stages; (b) a pair of output stages each comprised of a pair of transistors driven by an associated one of said amplifier input stages; and (c) sense transistors each connected to control the on and off state of an associated transistor and each cross coupled so as to be controlled by the state of a transistor in the other output stage such that only one transistor in each of said pair of output stages is conducting at any time The input stages have the capability of operating from TTL or ECL clock inputs by choosing a correct reference voltage and also provides the level shifting necessary for the inputs to the output transistors.

The sense transistors provide feedback in the form of charge stored in the output transistors to prevent a pair of output devices from turning on prior to the other pair turning off.

In the preferred embodiment, the output stage is formed of four vertical NPN bipolar devices and the amplifier input stages and sense transistors are formed with CMOS devices, thus making possible an integral BI-CMOS circuit.

The above and other objects and features of the present invention will be better understood when taken in conjunction with the following description and drawings wherein like characters indicate like parts and which drawings form a part of the present description.

DESCRIPTION OF THE PREFERRED EMBODIMENT

Figure 1:
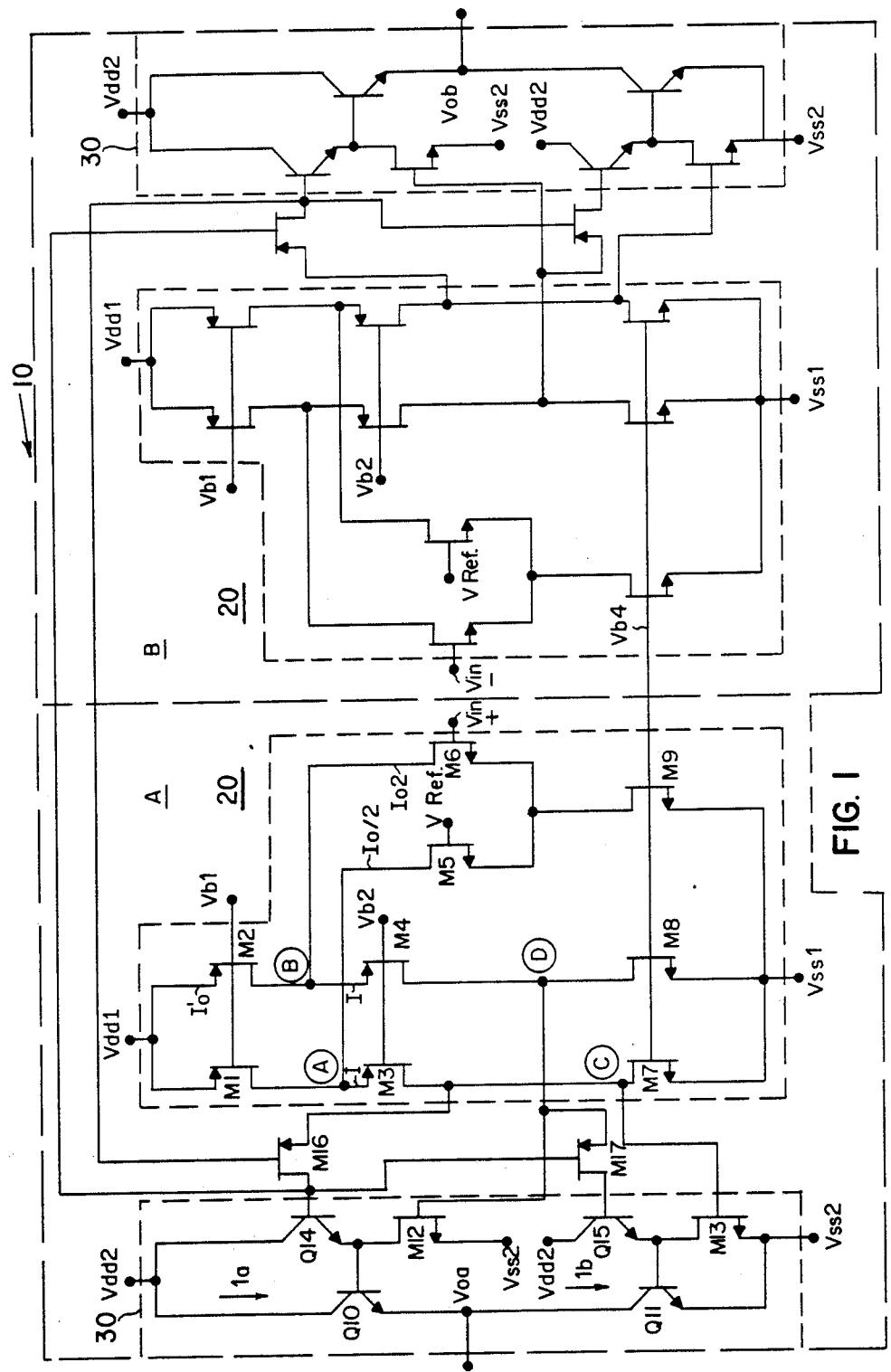
FIG. 1 is a schematic of the preferred embodiment of the invention.

Referring to FIG. 1, the BI-CMOS clock driver circuit 10 of the present invention is shown divided into two symmetrical component sections denoted A and B. Each section is comprised of a folded cascode CMOS amplifier input stage 20, a bipolar output stage 30, and 2 PMOS sense transistors (labeled M16 and M17 in the A component section.)

In the folded cascode CMOS amplifier input stage 20 a pair of current source, PMOS devices M1 and M2, are connected to the drains of a pair of NMOS devices, M5 and M6, respectively, for supplying bias currents to these devices. Devices M1 and M2 have their sources connected to a terminal for receiving a supply voltage Vdd1, and their gates connected to a terminal for receiving a bias voltage Vb1. Device M5 receives an input signal VREF on its gate and the device M6 receives a complementary input signal Vin+ on its base. A pair of PMOS devices M3 and M4 form a load for devices M5 and M6, respectively. The drains of devices M3 and M4 are connected to respective sources of PMOS devices M7 and M8. The gates of PMOS devices M3 and M4 are each connected to a terminal for receiving a bias voltage Vb2. The sources of devices M5 and M6 are each connected to the drain of a PMOS device M9. The sources of devices M7, M8, and M9 are connected to a reference potential such as ground. The gates of devices M7, M8, and M9 are connected to a terminal for receiving a bias voltage Vb3. Devices M7, M8, and M9 operate as a current mirror.

In operation, the dc current Io of device M9 is shared equally by M5 and M6. Also, the devices M1 and M5 provide equal bias currents Io' to nodes A and B. Therefore, devices M3 and M4 carry equal d bias currents I. Where I=Io' Io/2. A differential voltage applied to the gate inputs Vin- and Vin+ will offset the drain currents of M5 and M6 by proportional amounts. The currents Io' through M1 and M2 will remain unchanged, therefore, the currents I through M3 and M4 will change inversely proportional to the change in the currents Io/2 flowing through their associated devices M5 and M6. The load devices, formed by M7 and M8 reflects the current change at nodes C and D, respectively.

In the bipolar output stage 30, a pair of NPN transistors Q10 and Q11 are connected between a terminal for receiving a driving supply voltage Vdd2 and the reference potential. The emitter of Q10 is connected to an output terminal Voa and to the collector of Q11. The current flow through transistor Q10 is denoted Ia and the current flow through Q11 is denoted Ib. The base of Q10 is connected to the drain of an NMOS pull down transistor M12 with the gate of M12 being connected to the node D. The base of transistor Q11 is connected to the drain of an NMOS pull down transistor M13 with the gate of M13 being connected to the node C. The sources of M12 and M13 are connected to the Vss2. The drain of M12 is connected to the emitter of an NPN transistor Q14. The collector of Q14 is connected to the terminal for receiving the driving supply voltage Vdd2. The base of Q14 is connected to, the drain of M3 through a PMOS sense transistor M16, to the gate of a PMOS sense transistor M17, and to the gate of a PMOS sense transistor in the component section B corresponding to M16 in component section A. The sense transistor M17 connects the base of transistor Q15 to the node D The gate of sense transistor M16 is connected to the base of Q14 in section B and to the gate of transistor M17 in section B. This cross coupling provides a delay which insures that the pull down transistors turn off one device before the other is allowed to turn on.

Figure 2:
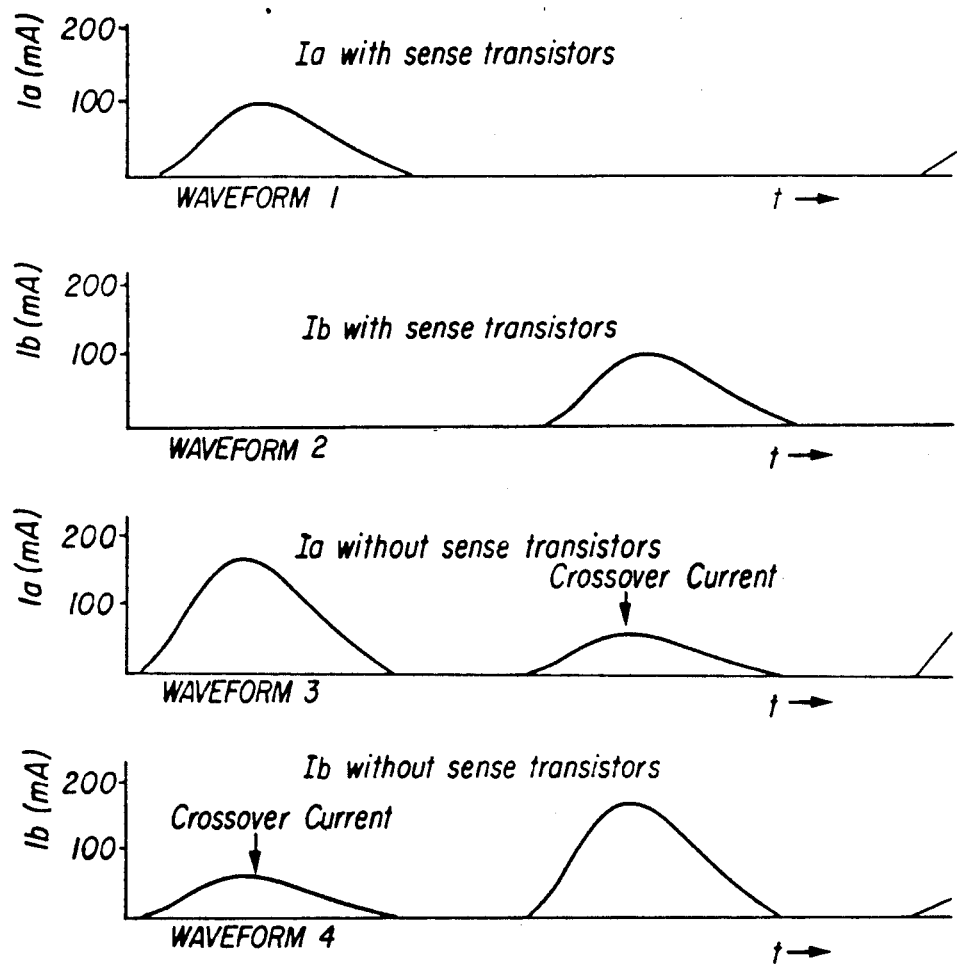
FIG. 2 illustrates by waveform diagrams the crossover and non-crossover current outputs from the embodiment of FIG. 1.

Referring now to FIG. 2, the drive currents Ia and Ib for the circuit of FIG. 1 show current flow in only one output device at any given time.

Waveforms 1 and 2 show the crossover current reduced to a zero value with the use of the sense transistors in the circuit embodiment of FIG. 1. Waveforms 3 and 4 show the relative magnitude of the crossover current when the sense transistors are removed from the circuit of FIG. 1.

Figure 3:
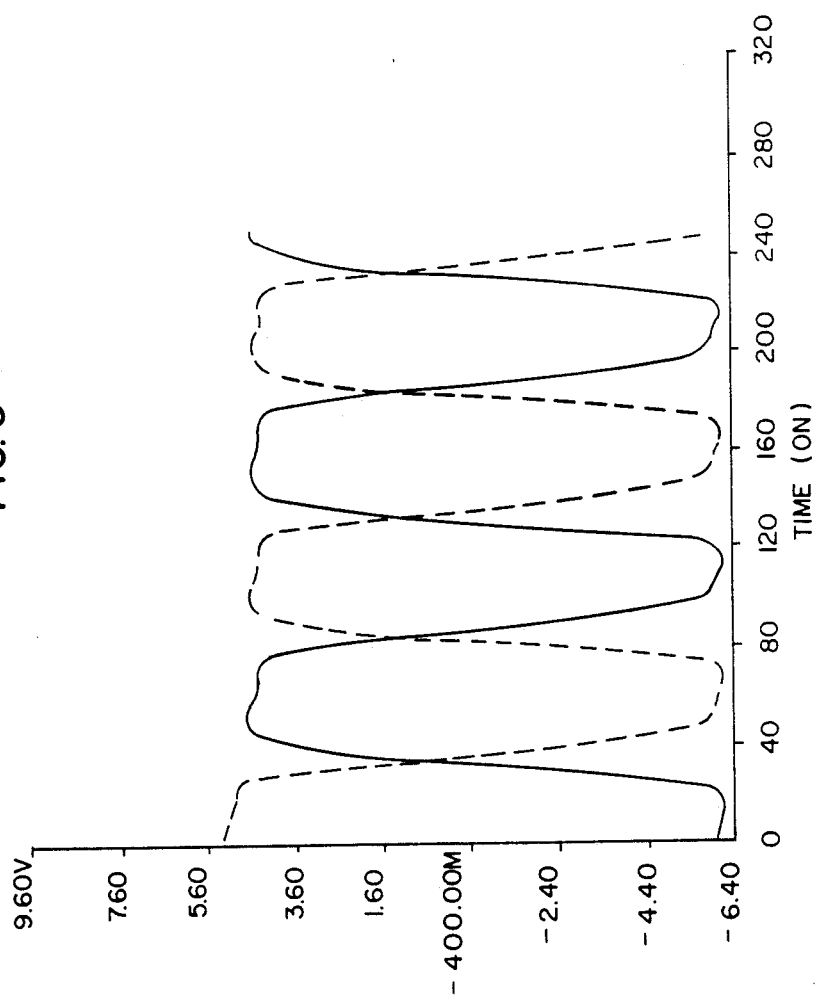
FIG. 3 is a waveform diagram illustrating the crossover point of the outputs of the preferred embodiment for one value of a bias voltage.

FIG. 3 illustrates the voltage waveform appearing at Voa and Vob for a value of VREF of −3.5 volts. Where Vdd=+6V, Vss=−6V.

Figure 4:
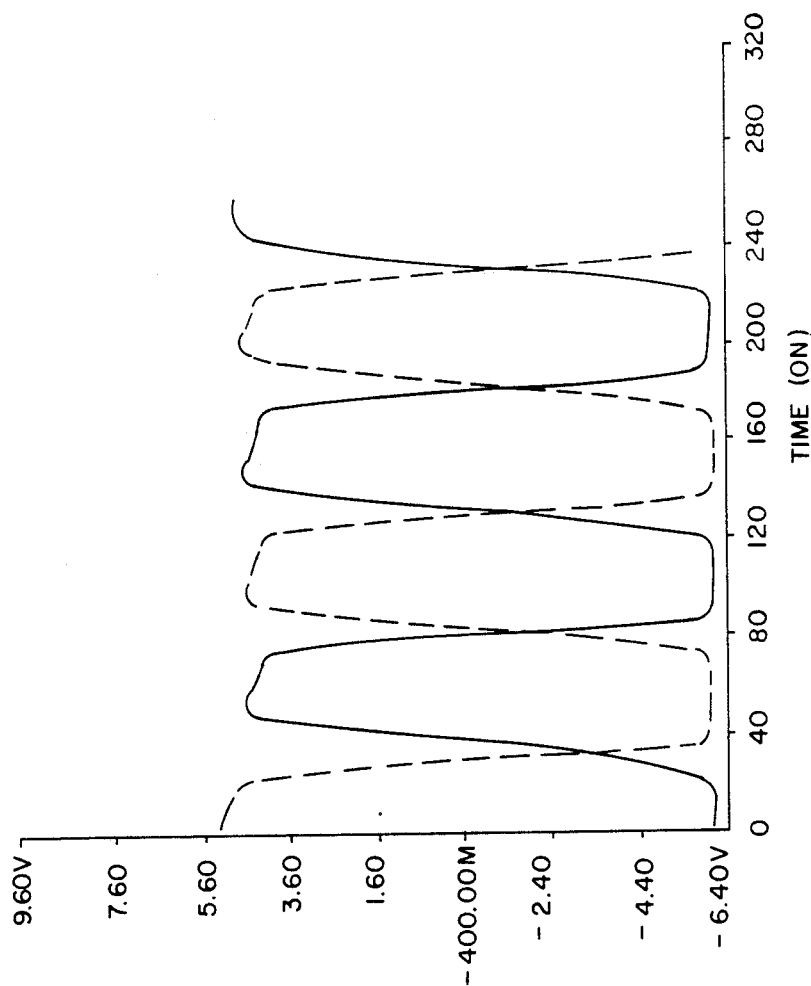
FIG. 4 is a waveform diagram illustrating the crossover point of the outputs of the preferred embodiment for a second value of a bias voltage.

FIG. 4 illustrates the voltage waveforms appearing at Voa and Vob for a value of VREF of −2.5 volts. The crossover point has been changed from approximately 1.4 volts in FIG. 3 to approximately −1.8 volts in FIG. 4. The crossover point can be selected by setting the bias voltage to a value which achieves the desired crossover.

Figure 5:
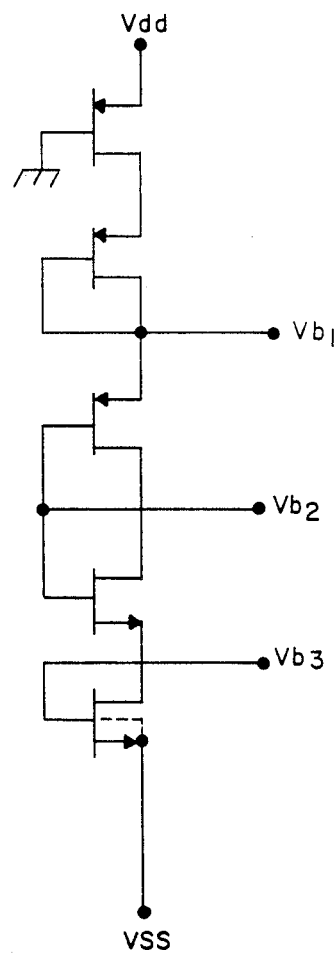
FIG. 5 is a bias chain for generating the bias voltages Vb1-Vb4 for the circuit of FIG. 1.

FIG. 5 illustrates one example of a bias chain for generating the bias voltages Vb1-Vb4 for the circuit of FIG. 1 from voltage sources Vdd and Vcc.

Typical voltage values for the preferred embodiment are:

$Vdd1 = Vdd2 = +6$ Volts
$Vss1 = Vss2 = -6$ Volts
$Vb1 = 4.10$ Volts
$Vb2 = 1.65$ Volts
$Vb3 = -4.35$ Volts While there has been shown what is considered to be the preferred embodiment of the invention, it will be manifest that many changes and modifications may be made therein without departing from the essential spirit of the invention. It is intended, therefore, in the annexed claims, to cover all such changes and modifications as may fall within the true scope of the invention.

I claim:

1. A BiCMOS clock driver circuit with reduced crossover current comprising:
   (a) a pair of amplifiers for receiving a differential input signal and for providing two pairs of complemented output signals;
   (b) sensing means including two pairs of sense transistors each one of the sense transistors of an associated pair connected to receive one of the a pair of complemented output signals from an associated one of said pair of amplifiers; and
   (c) output means including a pair of bipolar output stages each comprised of: a first pair of NPN transistors, serially connected to a source of potential, with the emitter of one transistor of each respective pair being connected to the collector of the other transistor to form an output connection, a second pair of NPN transistors each having an emitter connected to the bases of respective ones of said first pair of NPN transistors and with each of their collectors connectable to a source of potential and each of their bases coupled to said pair of amplifiers by a respective sense transistor so as to receive said complemented output signals.

2. A clock driver circuit with reduced crossover current according to claim 1 and further comprising:
   two pairs of pull down transistors each connected to the base of a respective one of said first pair of NPN transistors and a source of potential and controlled by the complemented output signals from said pair of amplifiers.

3. A clock driver circuit with reduced crossover current comprising:
   (a) a pair of folded cascode CMOS amplifier input stages;
   (b) a pair of bipolar output stages each comprised of vertical NPN transistor driven by an associated one of said folded cascode CMOS amplifier input stages; and
   (c) sense transistors each connected to control the on and off state of an associated vertical NPN transistor and each cross coupled so as to be controlled by the state of a vertical NPN transistor in the other bipolar output stage such that only one vertical NPN transistor in each of said pair of bipolar output stages is conducting at any time.

4. A clock driver circuit with reduced crossover current according to claim 3 and further comprising:
   a pair of reference voltage input terminals coupled to said pair of folded cascode CMOS amplifier input stages for receiving a reference voltage having a magnitude that is selected to achieve a desired crossover between the off and on states of said vertical NPN transistors.

5. A clock driver circuit with reduced crossover current according to claim 3, wherein said pair of folded cascode CMOS amplifier input stages each provides as an output to said pair of output stages a pair of complementary control signals in response to a differential input signal.

* * * * *

UNITED STATES PATENT AND TRADEMARK OFFICE
CERTIFICATE OF CORRECTION

PATENT NO. : 4,965,471

DATED : October 23, 1990

INVENTOR(S) : Joseph Gaboury

It is certified that error appears in the above-identified patent and that said Letters Patent is hereby corrected as shown below:

Column 1, line 32, after "and" insert "4,464,581 use cross coupled circuitry to delay an"
Column 1, lines 38 delete "obJect" and insert "object"
Column 1, line 39, insert "-" between "BI" and "MOS"
Column 2, line 31, insert "-" between "folded" and "cascode"
Column 2, line 56, delete "d" and insert "dc"
Column 2, line 57, after "I=Io" insert "-"
Column 3, line 22, insert "." after "D"
Column 4, line 4, delete "BiCMOS" and insert "Bi-CMOS"

Signed and Sealed this

Fourth Day of May, 1993

Attest:

MICHAEL K. KIRK

Attesting Officer

Acting Commissioner of Patents and Trademarks